United States Patent [19]

Kanuma

[11] Patent Number: 4,587,445
[45] Date of Patent: May 6, 1986

[54] DATA OUTPUT CIRCUIT WITH MEANS FOR PREVENTING MORE THAN HALF THE OUTPUT LINES FROM TRANSITIONING SIMULTANEOUSLY

[75] Inventor: Akira Kanuma, Yokohama, Japan
[73] Assignee: Kabushiki Kaisha Toshiba, Japan
[21] Appl. No.: 610,668
[22] Filed: May 16, 1984
[30] Foreign Application Priority Data May 18, 1983 [JP] Japan ................................ 58-87040

[51] Int. Cl.⁴ .................... H03K 17/16; H03K 19/003
[52] U.S. Cl. .............................. 307/443; 307/200 A;
307/242; 307/262; 307/464; 307/465; 307/475; 307/480; 328/110; 328/118
[58] Field of Search ................. 307/200 A, 441, 443, 307/464, 465, 471, 475, 480, 219, 355, 236, 241, 242, 246, 262, 272 R; 328/61–63, 74, 110, 118, 155

[56] References Cited

U.S. PATENT DOCUMENTS

| | | | |
|---|---|---|---|
| 3,666,968 | 5/1972 | Krocheski et al. | 328/118 X |
| 4,044,312 | 8/1977 | D'Ortenzio | 307/464 X |
| 4,063,174 | 12/1977 | Gupta et al. | 307/464 X |
| 4,342,065 | 7/1982 | Larson | 307/471 X |
| 4,398,101 | 8/1983 | Friauf | 307/465 X |
| 4,475,049 | 10/1984 | Smith et al. | 307/443 X |
| 4,481,427 | 11/1984 | Suzuki et al. | 307/200 A |

OTHER PUBLICATIONS

Gani et al., "Bilevel Line Driver and Receiver", *IBM T.D.B.*, vol. 17, No. 6, Nov. 1974, pp. 1616–1617.

*Primary Examiner*—Stanley D. Miller
*Assistant Examiner*—D. R. Hudspeth
*Attorney, Agent, or Firm*—Finnegan, Henderson, Farabow, Garrett & Dunner

[57] ABSTRACT

A data output circuit provided with data input terminals to which n-bit logic data is supplied, a latching section for holding this logic data, and output buffers for outputting in parallel the logic data held in the latching section.

The data output circuit further includes exclusive OR gates for detecting the non-coincidence between each of 1-bit signals applied from the data input terminals and its corresponding one of 1-bit output signals applied from the latching section; a majority circuit for generating an inversion control signal in response to the non-coincidences whose number is larger than n/2; and a circuit for generating a logic notation signal, synchronized with the data held in the latching section. The latching section holds the inverted replica of logic signals applied from the data input terminals in response to the inversion control signal.

11 Claims, 3 Drawing Figures

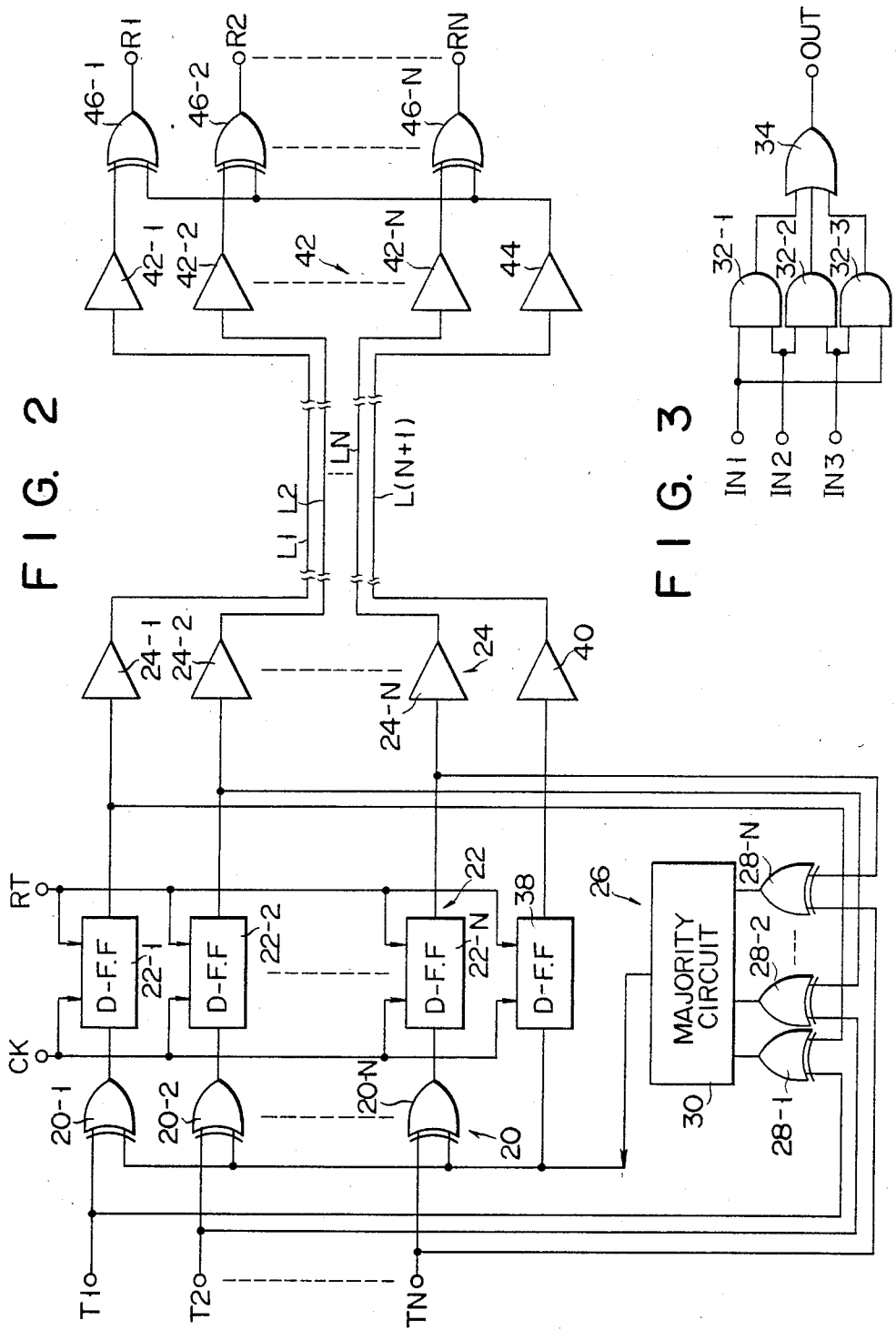

DATA OUTPUT CIRCUIT WITH MEANS FOR PREVENTING MORE THAN HALF THE OUTPUT LINES FROM TRANSITIONING SIMULTANEOUSLY

BACKGROUND OF THE INVENTION

The present invention relates to a data output circuit for the semiconductor logic device and more particularly, it relates to a data output circuit having a plurality of output buffers through which logic data are output in parallel.

FIG. 1 shows the conventional data output circuit for n-bit logic data. The n-bit logic data are generated through the logic circuit formed in same IC package as the data output circuit, and supplied to data input terminals T1 - TN. This output circuit includes flip-flops 10-1 ... 10-N for respectively holding logic signals applied from the data input terminals T1 - TN, and output buffers 12-1 ... 12-N for transmitting outside the IC package the logic signals applied from the flip-flops 10-1 ... 10-N. The output buffers 12-1 ... 12-N have an even number of or, for example, two CMOS inverters connected in series, and the logic signals are transferred from the output buffers 12-1 ... 12-N to input buffers 14-1 ... 14-N of the external logic device through bus lines L1 - LN, respectively. The input buffers 14-1 - 14-N are substantially the same in construction as the output buffers 12-1 ... 12-N, and the logic signals are supplied from the buffers 14-1 ... 14-N to the optional logic circuit (not shown) through terminals R1 - RN. The bus lines L1 - LN have parasitic capacitances C1 - CN, respectively, relative to the ground; said parasitic capacitances C1 - CN ranging from 10 pF to 100 pF substantially. The power source line which serves to supply power from IC package pins to logic elements (e.g. output buffers 12-1 ... 12-N) has an inductance of about 10 mH/cm.

When the logic data are re-newed, charge and discharge currents flow to and from the capacitors C1 - CN through the power source line, and noise voltage which prevents sudden current change is generated through the power source line. Particularly, when the logic data are re-newed from "000 ... 0" to "111 ... 1" or from "111 ... 1" to "000 ... 0", this noise voltage increases to erroneously operate the logic circuit in the IC package. This is the reason why the reliability relative to the integrated semiconductor logic device was low.

SUMMARY OF THE INVENTION

The object of the present invention is therefore to provide a data output circuit capable of reducing the level of noise voltage generated through the power source line when the logic data are updated.

According to the present invention, there is provided a data output circuit which comprises data input terminals for receiving logic signals of input data; a latching circuit connected to the data input terminals to hold the logic signals of input data in accordance with a first control signal and the inverted replica of said logic signals in accordance with a second control signal; a control signal generating circuit for checking the coincidence between each of the logic signals of updated input data applied to the data input terminals and a corresponding one of output signals of the latching circuit, and for supplying the first control signal when it is detected that the number of logic signals of the updated input data, which are the same in logic level as their corresponding output signals of the latching circuit, is larger than a preset value and also for supplying the second control signal when it is detected that the number of logic signals of the updated input data, which are the same in logic level as their corresponding output signals of the latching circuit, is not larger than the preset value; a notation signal generating circuit for generating a logic notation signal, which represents the logic notation with respect to the output signals of the latching circuit, in accordance with an output signal applied from the control signal generating circuit; and a parallel output buffer circuit for supplying logic signals of the latching circuit and the logic notation signal from the notation signal generating circuit.

BRIEF DESCRIPTION OF THE DRAWINGS

FIG. 2 is a circuit diagram showing a data output circuit embodied according to the present invention; and FIG. 3 is a circuit diagram intended to explain the construction of a majority circuit which can receive three input signals.

DETAILED DESCRIPTION OF THE PREFERRED EMBODIMENT

Figure 1:
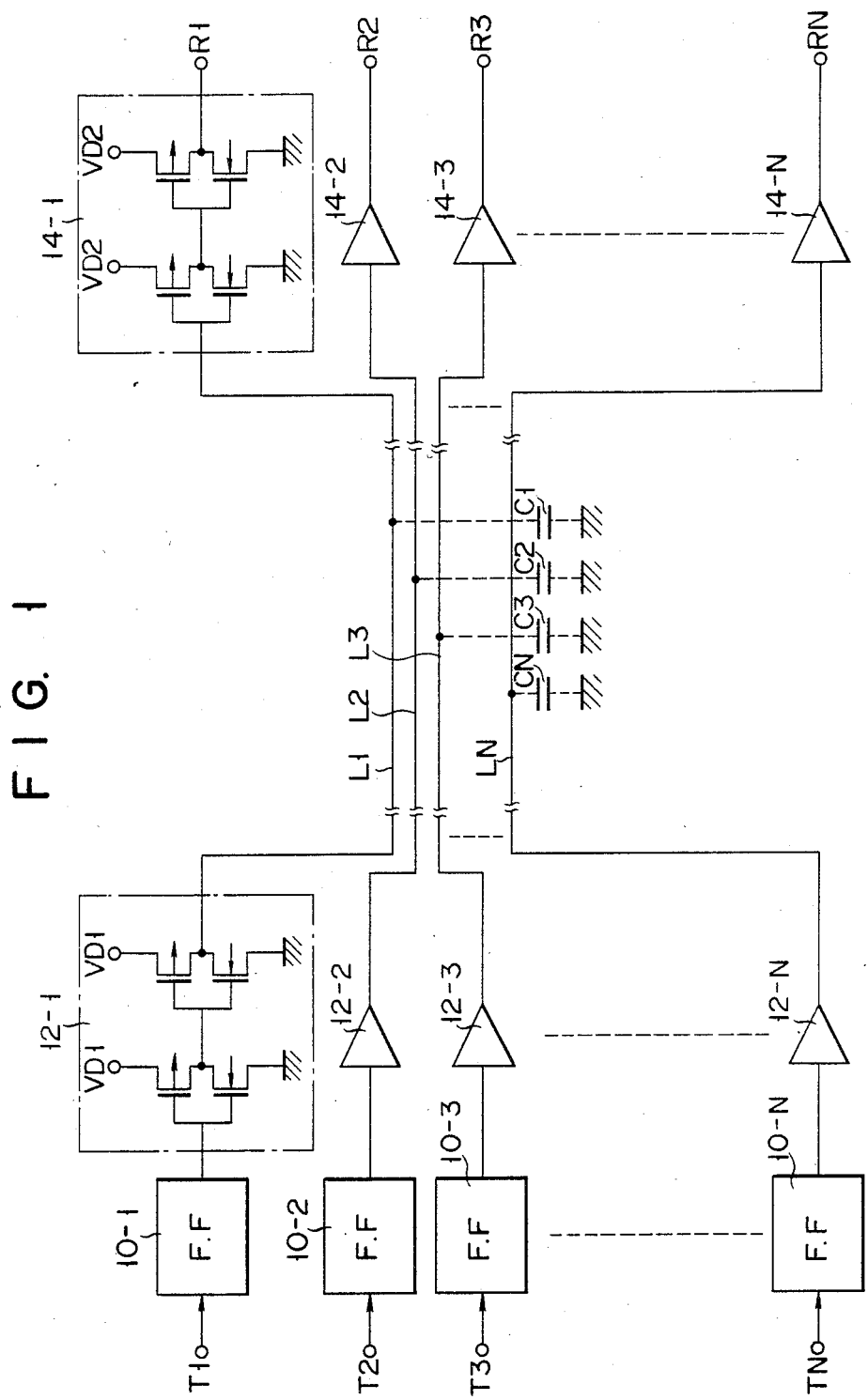
FIG. 1 shows the conventional data output circuit.

A data output circuit embodied according to the present invention will be described referring to FIG. 2. For example, the data output circuit is formed in an IC package (not shown) for various kinds of the semiconductor logic devices. The data output circuit supplies logic data, which have been supplied to data input terminals T1, T2, ... TN, to an external circuit arranged outside the package. The data output circuit includes an inverting section 20 which can invert all logic values of n bit-signals applied from the data input terminals T1 - TN, a latching section 22 for holding the logic signals supplied from the inverting section 20, and a buffer section 24 for transferring the logic signals, which are being held by the latching section 22, to bus lines L1 - LN. The inverting section 20 has n exclusive OR gates 20-1, 20-2, ... 20-N whose first input terminals, for example, are connected to the data input terminals, and the latching section 22 has D-type flip-flop 22-1, 22-2, ... 22-N whose D-input terminals, for example, are connected to output terminals of the exclusive OR gates 20-1, 20-2, ... 20-N. Clock terminals of the D-type flip-flops 22-1 ... 22-N are connected commonly to a control terminal CK to which a clock pulse is supplied each time the logic data are supplied to the terminals T1 - TN. Reset terminals of the D-type flip-flops 22-1 ... 22-N are connected commonly to a control terminal RT which serves to receive a reset signal. The buffer section 24 has n output buffers 24-1, 24-2, ... 24-N whose input terminals are connected to output terminals of the D-type flip-flops 22-1 ... 22-N, respectively.

The data output circuit further includes a control section 26 for conditionally generating inversion control signals to be supplied to the inverting section 20. The control section 26 has n exclusive OR gates 28-1, 28-2, ... 28-N whose first and second input terminals are connected to the data input terminals T1 - TN and the D-type flip-flops 22-1 ... 22-N, respectively, and a majority circuit 30 for generating the inversion control signals when the number of non-coincident signals (i.e. high level), supplied from any one of the exclusive OR gates 28-1 . . . 28-N, is larger than N/2. FIG. 3 shows the majority circuit when n=3, for example. The majority circuit shown in FIG. 3 has input terminals IN1 - IN3 to which the non-coincident signals (or high level signals) are selectively supplied, AND gates 32-1 . . . 32-3 whose first and second input terminals are connected to the input terminals IN1 and IN2, IN2 and IN3, and IN3 and IN1, respectively, and an OR gate 34 for generating the inversion control signal responsive to at least one high level signal applied from the AND gates 32-1 . . . 32-3. The inversion control signal is supplied from the majority circuit 30 to the second input terminals of the exclusive OR gates 20-1 . . . 20-N in the inverting section 20. On the other hand, the inversion control signal is supplied to an input terminal D of a D-type flip-flop 38. Clock and reset terminals of the D-type flip-flop 38 are connected to the control terminals CK and RT, respectively. An O-output terminal of the D-type flip-flop 38 is connected to the input terminal of an additional output buffer 40. The D-type flip-flop 38 generates the logic notation signal synchronous with the latching of the latch section 22. Output signals of the output buffers 24-1 . . . 24-N and 40 are transferred to input buffers 42-1 . . . 42-N and 44, respectively, in the external logic device through the bus lines L1 - L(N+1). Exclusive OR gates 46-1 . . . 46-N invert the logic signals applied from the input buffers 42-1 . . . 42-N in response to a high level logic notation signal applied from the input buffer 44. Output signals of the exclusive OR gates 46-1 . . . 46-N are supplied to data terminals R1 - RN to which an optional logic circuit can be connected.

In operation, a reset signal is applied to the control terminal RT, at first, to clear all of the contents stored in the flip-flops 22-1 . . . 22-N and 38. Then, the flip-flops provide the output buffers 24-1 . . . 24-N and 40 with low level logic signals "L", respectively. For example, when the data input terminals T1 - TN receive logic data "100 . . . 0", a high level logic signal "H" and low level logic signals "L" are supplied from the terminal T1 and from the terminals T2 - TN, respectively, to the exclusive OR gates 20-1 . . . 20-N. The exclusive OR gates 28-1 . . . 28-N in the control section 26 compare the logic signals applied from the terminals T1 - TN with those applied from the D-type flip-flops 22-1 . . . 22-N. The non-coincident signal is supplied only from the flip-flop 22-1 to the majority circuit in this case. The majority circuit 30 generates an inversion control signal (i.e. logic signal "H") when majority bits of the logic data are changed in level or when the non-coincident signals whose number is larger than N/2 are received. In this case, the majority circuit supplies a low level logic signal "L" to the exclusive OR gates 20-1 . . . 20-N and 36 in response to the non-coincident signals smaller in number than N/2. The exclusive OR gates 20-1 . . . 20-N transfer the logic signals from the data input terminals T1 - TN to the D-type flip-flops 22-1 . . . 22-N, respectively, without inverting the logic signals. The flip-flops 22-1 . . . 22-N hold the logic signals applied from the exclusive OR gates 20-1 . . . 20-N in response to a clock pulse applied from the control terminal CK. On the other hand, the D-type flip-flop 38 holds the logic signal "L" applied from the majority circuit in response to the same clock pulse. This signal "L" is used as a positive logic notation signal. The output buffers 24-1 . . . 24-N and 40 generate logic signals which correspond to those applied from the D-type flip-flops 22-1 . . . 22-N and 38. Output signals of the output buffers 24-1 . . . 24-N and 40 are transferred to the input buffers 42-1 . . . 42-N and 44, respectively, in the external logic device through their respective bus lines L1 - L(N+1). The exclusive OR gates 46-1 . . . 46-N supply to the data terminals R1 - RN, respectively, output signals having a level which is determined according to the output signals of the input buffers 42-1 . . . 42-N and the logic notation signal applied from the input buffer 44. When the positive logic notation signal (low level) is applied to the exclusive OR gates 46-1 . . . 46-N, the output signals of the input buffers 42-1 . . . 42-N are not inverted. Logic data the same as those input to the terminals T1 - TN, can be thus obtained through the terminals R1 - RN.

Thereafter, the data input terminals T1 - TN receive the logic data to be output next. Providing that this logic data is "111 . . . 1", for example, the exclusive OR gate 28-1 compares the logic signal "H" applied from the terminal T1 with the output signal "H" of the D-type flip-flop 22-1. The non-coincident signal is not generated by the exclusive OR gate 28-1 this time. The exclusive OR gates 28-2 . . . 28-N detect the difference between each of the logic signals "H" applied from the terminals T2 - TN and each of the output signals "L" of the D-type flip-flops 22-2 . . . 22-N. N-1 non-coincident signals are supplied from the flip-flops 22-2 . . . 22-N to the majority circuit 30 to generate an inversion control signal ("H" level). The exclusive OR gates 20-1 . . . 20-N invert the logic signals applied from the data input terminals T1 - TN in response to the inversion control signal. When a clock pulse is supplied to the control terminal CK, the D-type flip-flops 22-1 . . . 22-N latch the logic signals "L", respectively, applied from the exclusive OR gates 20-1 . . . 20-N. On the other hand, the D-type flip-flop 38 holds the logic signal "H" applied from the majority circuit 30 in response to the clock pulse applied from the control terminal CK. Similar to the above-described case, output signals of the D-type flip-flops 22-1 . . . 22-N and 38 are transferred to the input buffers 42-1 . . . 42-N and 44 through the output buffers 24-1 . . . 24-N, 40 and the bus lines L1 - L(N+1). The exclusive OR gates 46-1 . . . 46-N invert the output signals of the input buffers 42-1 . . . 42-N in response the logic signal "H" or the negative logic notation signal applied from the input buffer 44. More specifically, the logic data "111 . . . 1" supplied to the terminals T1 - TN is changed to the logic data "000 . . . 0" and then transmitted from the output buffers 24-1 . . . 24-N, and again changed to the logic data "111 - 1" through the exclusive OR gates 46-1 . . . 46-N and then supplied to the terminals R1 - RN.

The input data of the data input terminals T1 - TN are successively updated, but when the difference between input and output signals of the D-type flip-flops 22-1 . . . 22-N is larger than N/2, an inversion control signal "H" is again generated by the majority circuit 30. The logic value of each bit of the logic data is thus inverted and transmitted through the output buffers 24-1 . . . 24-N, while 1-bit logic notation signal is transmitted through the output buffer 40.

According to the data output circuit as described above, the number of n bit-signals output at the same time from the output buffers 24-1 . . . 24-N and which are changed in logic level is limited to less than n/2 even when it is needed that the 1-bit logic notation signal is additionally transferred and the input data of the data input terminals T1 - TN are optionally updated. Therefore, current flowing through the power source line to charge and discharge the parasitic capacitances of the bus lines, which are regarded as loads of the output buffers 24-1 ... 24-N, is reduced. Malfunction of the logic circuit in the IC package is thus seldom caused by the noise voltage generated through the power source line because of this current.

Providing that n-bit logic data is updated from "000 . . . 0" to "111 . . . 1", for example, all of the logic signals appearing on n-unit bus lines are changed to thereby allow the next charge current to flow through the power source line just after the updating of the logic data:

$$nC (VH-VL)$$

wherein C represents the parasitic capacitances of bus lines, VH a voltage level corresponding to the logic signal "H", and VL a voltage level corresponding to the logic signal "L".

On the other hand, the next charge current is allowed to flow only through the (n+1)th bus line which serves to transmit the logic notation signal, and the logic signals appearing on the n-unit bus lines are kept unchanged in the case of the embodiment of the present invention:

$$C (VH-VL).$$

According to the present invention, the level of the noise voltage caused through the power source line, following the updating of the logic data, can be reduced. Therefore, malfunction of the logic circuit in the IC package to which power is supplied through the power source line is seldom caused, thereby enhancing the reliability of the semiconductor logic device.

With the above-described embodiment, the second input terminals of the exclusive OR gates 28-1 ... 28-N have been connected to the Q-output terminals of the D-type flip-flops 22-1 ... 22-N, respectively, but they may be arranged to receive the logic signals from the output terminals of the output buffers 24-1 ... 24-N.

A detecting circuit, which generates an inversion control signal when it is detected that the number of the non-coincident signals applied from the exclusive OR gates 28-1 ... 28-N exceeds a certain value, may be used instead of the majority circuit 30.

What is claimed is:

1. A data output circuit comprising:
data input terminals for receiving logic signals of input data;
a latching means, connected to the data input terminals, to hold the logic signals of input data in accordance with a first control signal and the inverted replica of said logic signals in accordance with a second control signal;
a control signal generating means for checking the coincidence between each of the logic signals of updated input data applied to the data input terminals and a corresponding one of the output signals of said latching means, and supplying the first control signal when it is detected that the number of the logic signals of said updated input data, which are same in logic level as their corresponding output signals of said latching means, is larger than a preset value, and also supplying the second control signal when it is detected that the number of the logic signals of said updated input data, which are same in logic level as their corresponding output signals of said latching means, is not larger than the preset value;
a notation signal generating means for generating a logic notation signal, which represents the logic notation with respect to the output signals of said latching means, in accordance with an output signal applied from said control signal generating means; and
output buffer means for supplying logic signals which correspond to the output signals of said latching means and the logic notation signal applied from the notation signal generating means.

2. A data output circuit according to claim 1, wherein said latching means includes a plurality of transferring circuits, connected to said data input terminals, to respectively supply the logic signals of said input data in response to the first control signal and the inverted replica of said logic signals in response to the second control signal, and a plurality of latching circuits for holding the respective output signals of said transferring circuits in response to a clock pulse.

3. A data output circuit according to claim 2, wherein said transferring circuits are exclusive OR gates.

4. A data output circuit according to claim 2, wherein said latching circuits are D-type flip-flops.

5. A data output circuit according to claim 2, wherein said output buffer means includes a plurality of first output buffers for supplying logic signals which correspond to the output signals of said latching circuits, and a second output buffer for supplying a logic signal which corresponds to the logic notation signal applied from said notation signal generating means.

6. A data output circuit according to claim 5, wherein said control signal generating means includes a plurality of comparators, each checking the coincidence between one of the logic signals of updated input data applied to said data input terminals and its corresponding one of the output signals of said latching means, and a detecting circuit for supplying one of the first and second control signals in accordance with the number of coincident signals applied from said comparators.

7. A data output circuit according to claim 6, wherein said comparators are exclusive OR gates whose first input terminals are connected to said data input terminals, and whose second input terminals are connected to their corresponding output terminals of said latching circuits.

8. A data output circuit according to claim 5, wherein said comparators are exclusive OR gates whose first input terminals are connected to said data input terminals, and whose second input terminals are connected to their corresponding output terminals of said first output buffers.

9. A data output circuit according to claim 7, wherein said detecting circuit is a majority circuit.

10. A data output circuit according to claim 7, wherein said notation signal generating means includes a D-type flip-flop for supplying a logic signal, which corresponds to the output signal of said control signal generating means, in response to the clock pulse.

11. A data output circuit comprising:
data input terminals for respectively receiving logic signals of input data;
a latching means, connected to the data input terminals, to hold the logic signals of input data in accordance with a first control signal and the inverted replica of said logic signals in accordance with a second control signal;

a control signal generating means for checking the coincidence between each of the logic signals of updated input data applied to the data input terminals and its corresponding one of the output signals of said latching means, and supplying the first control signal when it is detected that the number of the logic signals of said updated input data, which are same in logic level as their corresponding output signals of said latching means, is larger than a preset value, and also supplying the second control signal when it is detected that the number of the logic signals of said updated input data, which are the same in logic level as their corresponding output signals of said latching means, is not larger than the preset value;

a notation signal generating means for generating a logic notation signal, which represents the logic notation with respect to the output signals of said latching means, in accordance with an output signal applied from said control signal generating means;

an output buffer means for supplying logic signals which correspond to the output signals of said latching means and the logic notation signal applied from the notation signal generating means;

bus lines through which the output signals of said output buffer means are transferred; and a transferring means for supplying one of the logic signals from said bus lines and the inverted replica of said logic signal in accordance with the logic notation signal.

* * * * *